(12) United States Patent
Reinhardt et al.

(10) Patent No.: US 8,692,630 B2
(45) Date of Patent: Apr. 8, 2014

(54) GUIDED ACOUSTIC WAVE RESONANT DEVICE AND METHOD FOR PRODUCING THE DEVICE

(75) Inventors: Alexandre Reinhardt, Grenoble (FR); Issiaka Kone, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 437 days.

(21) Appl. No.: 12/827,875

(22) Filed: Jun. 30, 2010

(65) Prior Publication Data
US 2010/0327995 A1  Dec. 30, 2010

(30) Foreign Application Priority Data

Jun. 30, 2009 (FR) ...................... 09 03186

(51) Int. Cl.
*H03H 9/70* (2006.01)
*H03H 9/54* (2006.01)

(52) U.S. Cl.
USPC ............................ 333/133; 333/189; 333/193

(58) Field of Classification Search
USPC ........................ 333/133, 187–189, 193, 195
See application file for complete search history.

(56) References Cited

U.S. PATENT DOCUMENTS

| | | | |
|---|---|---|---|
| 5,726,610 A | | 3/1998 | Allen et al. |
| 6,107,721 A | * | 8/2000 | Lakin ............................ 310/321 |
| 6,121,856 A | * | 9/2000 | Apostolos ...................... 333/141 |
| 6,407,649 B1 | * | 6/2002 | Tikka et al. .................... 333/133 |
| 6,441,703 B1 | | 8/2002 | Panasik |
| 6,445,265 B1 | * | 9/2002 | Wright ........................... 333/193 |

(Continued)

FOREIGN PATENT DOCUMENTS

| FR | 2 882 205 A1 | 8/2006 |
|---|---|---|
| JP | 2005-223808 A | 8/2005 |

(Continued)

OTHER PUBLICATIONS

I. Kone et al.; "Resonator Using Guided Waves in a Piezoelectric Layer Above a Bragg Mirror"; 2008 IEEE International Frequency Control Symposium; pp. 581-585, May 19-21, 2008.*

(Continued)

*Primary Examiner* — Barbara Summons
(74) *Attorney, Agent, or Firm* — Baker & Hostetler LLP

(57) ABSTRACT

A guided acoustic wave resonant device is provided. The device comprises at least two filters ($F_1, \ldots, F_i, \ldots, F_N$), each filter comprising at least two acoustic wave resonators ($R_{11}$-$R_{12}, \ldots, R_{i1}$-$R_{i2}, \ldots, R_{N1}$-$R_{N2}$), each filter having a useful frequency band ($BF_1, \ldots, BF_i, \ldots, BF_N$) centered on a central frequency ($f_1, \ldots, f_i, \ldots, f_N$), each resonator comprising at least one suite of inter-digitated upper electrodes exhibiting a periodic structure of period ($\Lambda_{ij}$) and a layer of piezoelectric material, each resonator having a coupling coefficient ($k^2_1, k^2_2, \ldots, k^2_n$) and a resonant frequency ($fr_1, \ldots, f_{r2}, \ldots, f_N$), wherein at least one of the resonators comprises a differentiation layer ($CDf_i$) making it possible in combination with the period of the inter-digitated electrodes to modify the coupling coefficient of the said resonator, the useful band and the central frequency being determined by the resonant frequencies and the coupling coefficients of the resonators which are adapted so as to have a determined useful bandwidth.

13 Claims, 9 Drawing Sheets

(56) References Cited

U.S. PATENT DOCUMENTS

| | | | |
|---|---|---|---|
| 6,448,695 B2 * | 9/2002 | Milsom | 310/334 |
| 6,462,460 B1 * | 10/2002 | Tikka et al. | 310/312 |
| 6,657,363 B1 | 12/2003 | Aigner | |
| 6,734,600 B2 | 5/2004 | Aigner | |
| 7,535,152 B2 * | 5/2009 | Ogami et al. | 310/313 A |
| 2002/0093399 A1 | 7/2002 | Takata | |
| 2004/0227587 A1 | 11/2004 | Inoue et al. | |
| 2006/0076852 A1 * | 4/2006 | Ruile et al. | 310/313 R |
| 2006/0091978 A1 * | 5/2006 | Wang et al. | 333/189 |
| 2007/0241841 A1 | 10/2007 | Hauser et al. | |
| 2007/0296513 A1 * | 12/2007 | Ruile et al. | 331/116 R |
| 2008/0067891 A1 | 3/2008 | Matsuda et al. | |
| 2008/0211602 A1 | 9/2008 | Khelif et al. | |
| 2009/0102316 A1 * | 4/2009 | Belot et al. | 310/311 |
| 2010/0039000 A1 * | 2/2010 | Milson et al. | 310/366 |

FOREIGN PATENT DOCUMENTS

| | | |
|---|---|---|
| JP | 2008-113061 A | 5/2008 |
| WO | 2006/087496 A1 | 8/2006 |
| WO | 2006/126168 A1 | 11/2006 |

OTHER PUBLICATIONS

S.-H. Lee et al.; "Influence of Electrodes and Bragg Reflector on the Quality of Thin Film Bulk Acoustic Wave Resonators"; 2002 IEEE International Frequency Control Symposium and PDA Exhibition; pp. 45-49, 2002.*

G. T. Andrews, et al., "Elastic characterization of a supported porous silicon layer by Brillouin scattering," Appl. Phys. Lett. 69 (9), Aug. 26, 1996, pp. 1217-1219.

D. Bellet, et al., "Nanoindentation investigation of the Young's modulus of porous silicon," J. Appl. Phys. 80 (7), Oct. 1, 1996, pp. 3772-3776.

R.J.M. Dafonseca, et al., "Elastic characterization of porous silicon by acoustic microscopy," Superlattices and Microstructures, vol. 16, No. 1, Sep. 5, 1994, pp. 21-23.

Kuypers et al.—Green's Function Analysis of Lamb Wave Resonators—2008 IEEE International Ultrasonics Symposium Proceedings—digital Object Identifier; 10, 1 109/ULTSYM 2008.0377; pp. 1548-1551.

Search Report received in corresponding European Application No. 10167447.1, dated Oct. 25, 2010, and Opinion, 11 pages.

* cited by examiner

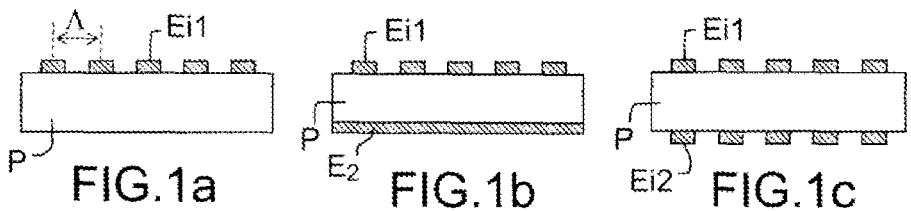
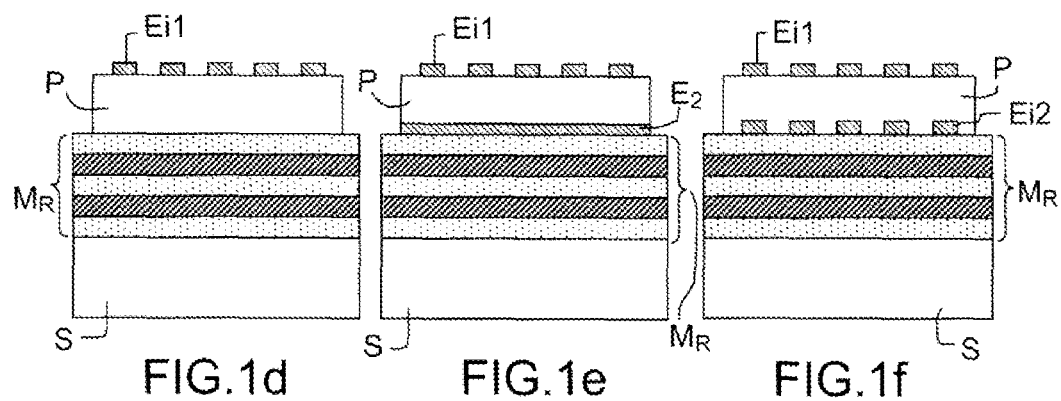
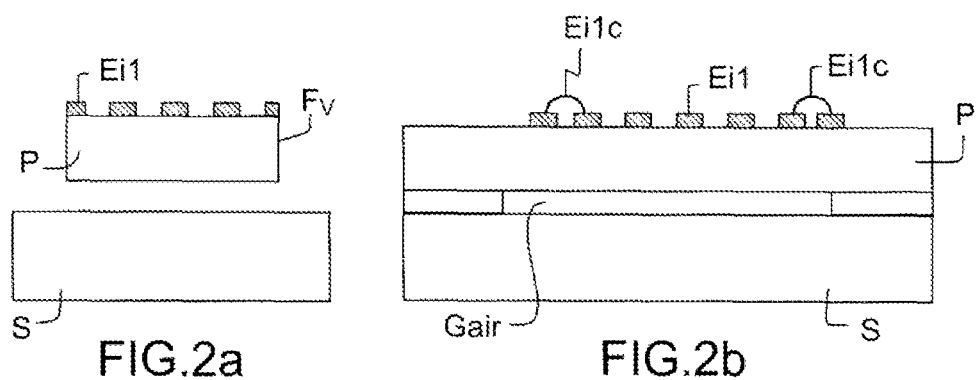

GUIDED ACOUSTIC WAVE RESONANT DEVICE AND METHOD FOR PRODUCING THE DEVICE

CROSS-REFERENCE TO RELATED APPLICATIONS

This application claims priority to foreign Patent Application FR 09 03186, filed on Jun. 30, 2009, the disclosure of which is incorporated herein by reference in its entirety.

FIELD OF THE INVENTION

The field of the invention is that of electromechanical devices utilizing the propagation of acoustic waves in thin piezoelectric layers with a view notably to producing a resonant device for functions relating to sensors, time bases or electrical filters such as bandpass filters.

Such devices exhibit operating frequencies of the order of a few hundred MHz to a few GHz, and are used in radiofrequency transmission circuits (portable telephone, radio link, wireless data exchange, etc.), signal processing circuits or in sensor systems.

BACKGROUND OF THE INVENTION

In a general manner, guided wave resonators utilize the capacity of a piezoelectric material to deform under the application of an electric field. In the presence of an alternating electrical signal, acoustic waves are generated. When these waves are structurally confined in a part of the structure (for example, a layer), one then speaks of guided waves. The most generic example is that of Lamb waves, which correspond to waves propagating in a plate and confined in this plate, given their reflection at the solid/air interfaces. The confinement can also be brought about through the impossibility of the waves propagating in a given medium because of total internal reflections (analogous to the confinement of light in an optical fiber). It can also be afforded through the use of an acoustic mirror. By inverse piezoelectric effect, the stresses associated with the propagation of an elastic wave lead to the generation of an electric current in the electrodes, this being manifested as an electrical resonance.

These resonators consequently take the form of a piezoelectric layer, optionally deposited on a stack of layers called a Bragg mirror, capable of reflecting acoustic waves, whatever their polarizations, and thus of confining them in the piezoelectric medium. A layer structure suspended or deposited on a Bragg mirror makes it possible to insulate the resonator in the vertical direction and to avoid losses by acoustic radiation in the substrate. Electrodes are positioned either on the surface, or on either side of the piezoelectric layer, so as to excite an electric field in the active material as described elsewhere.

The upper electrodes exhibit the appearance of two inter-digitated combs whose period Λ is equal to a half-wavelength and are produced on the surface of a plate of piezoelectric material P. The lower electrodes, if they exist, can either be limited to an electric plane $E_2$, or be likewise in the form of two inter-digitated combs $E_{i2}$. These various resonator structures are represented in FIGS. 1a to 1c respectively.

Guided wave resonator structures are represented in FIGS. 1d to 1f using Bragg mirror structures MR produced on the surface of a substrate S, to confine the acoustic waves in the piezoelectric material. In all cases, the periodicity of the electrodes fixes the resonant frequency, since these two quantities are linked by way of the wave propagation speed:

$$\lambda = \frac{V}{f}$$

where λ is the wavelength, V the wave propagation speed and f the resonant frequency.

To avoid energy leakages on the edges of the resonators, it is common practice to limit the piezoelectric layer in which the waves propagate by a vertical flank Fv as illustrated in FIG. 2a. The exact disposition of this flank depends on the vibration mode utilized, but must also correspond to a vibration antinode so that the operation of the resonator is disturbed as little as possible. It should be noted that this etching can also be extended more deeply by etching the layers of the Bragg mirror, or indeed the substrate.

It is also possible to use a reflecting array composed of short-circuited electrodes $E_{iIc}$ as illustrated in FIG. 2b in the case of a device comprising a membrane produced on the surface of a substrate S of piezoelectric material P, making it possible to create an air gap $G_{air}$ ensuring a function of confining the acoustic waves in the piezoelectric material and thereby making it possible to dispense with a Bragg mirror structure.

The electrical response of guided wave resonators is manifested as abrupt variations of the electrical impedance as a function of frequency. A key quantity in components of this type is the piezoelectric coupling coefficient. A measurement of this coefficient is accessible through the following formula:

$$k^2 = \frac{f_a - f_r}{f_a}$$

where $f_r$ is the resonant frequency (corresponding to a minimum impedance of the resonator) and $f_a$ the anti-resonant frequency (corresponding to a maximum impedance of the resonator).

To produce, for example, a bandpass filter, at least two resonators are generally necessary. A bandpass filter is obtained in a known manner by electrical association or by acoustic coupling of the resonators, these associations or couplings being intended to allow the electrical signal to pass through the complete component only over a certain frequency range, and to prevent its passage over the remainder of the spectrum.

Likewise, it is possible to produce a bank of filters. Such a component associates several filters having approximately the same bandwidth, but all shifted with respect to one another, so as to allow the passage for each of them of just a part of a wider spectrum. A well known example may be to provide a bank of filters making it possible to filter a television or radio channel, for each filter. All the filters having to exhibit the same bandwidth, it is necessary to provide resonators at various frequencies but with comparable piezoelectric coupling coefficients.

Thus on the basis of a guided wave resonator utilizing a thickness vibration mode, denoted TE1 (for Thickness Extensional 1), it is easy to produce filters with different frequencies: it suffices to modify the geometric parameters, and notably the period of the excitation electrodes.

An exemplary stack is summarized in table T1 hereinafter, namely the stack of layers Mo, $SiO_2$, SiN, SiOC, SiN, SiOC constituting a Bragg mirror, the piezoelectric layer being made of AlN covered with SiN acting as passivation layer.

TABLE T1

| Layer | Thickness |
|---|---|
| SiN | 250 nm |
| AlN | 1850 nm |
| Mo | 300 nm |
| SiO$_2$ | 210 nm |
| SiN | 1500 nm |
| SiOC | 270 nm |
| SiN | 1500 nm |
| SiOC | 270 nm |
| Silicon | (considered semi-infinite) |

For example, filters at 2 GHz, 1.98 GHz and 1.96 GHz may be produced by coupling two resonators like those described hereinafter:

|  | Resonator 1 | Resonator 2 |
|---|---|---|
| SiO$_2$ thickness | 210 nm | |
| Period | 10 μm | 8.5 μm |
| $f_r$ | 1984.5 MHz | 2000 MHz |
| $f_a$ | 1999.5 MHz | 2012.4 MHz |
| $k^2$ | 0.75% | 0.61% |

Filter Centered on 2 GHz

|  | Resonator 1 | Resonator 2 |
|---|---|---|
| SiO$_2$ thickness | 210 nm | |
| Period | 13.7 μm | 10.4 μm |
| $f_r$ | 1958.7 MHz | 1980.6 MHz |
| $f_a$ | 1979.7 MHz | 1996.5 MHz |
| $k^2$ | 1.06% | 0.80% |

Filter Centered on 1.98 GHz

|  | Resonator 1 | Resonator 2 |
|---|---|---|
| SiO$_2$ thickness | 210 nm | |
| Period | 26.7 μm | 13.4 μm |
| $f_r$ | 1930.2 MHz | 1960.2 MHz |
| $f_a$ | 1960.2 MHz | 1980.9 MHz |
| $k^2$ | 1.53% | 1.04% |

Filter Centered on 1.96 GHz

Nonetheless, in this case a bank of three guided wave filters is produced, exhibiting different bandwidths respectively of 18 MHz to 2000 MHz for the filter $F_{10}$, of 25 MHz to 1980 MHz for the filter $F_{20}$ and of 40 MHz to 1960 MHz for the filter $F_{30}$, as illustrated in FIG. 3.

SUMMARY OF THE INVENTION

The applicant started from the finding that in order to ensure constant transmission in a given useful band (this useful band corresponds to the passband in the case of a bandpass filter), it was necessary to approximately adjust the anti-resonant frequency of a first type of resonator with the resonant frequency of a second type of resonator, this corresponding to the piezoelectric coupling coefficient seen above, thereby directly fixing the attainable bandwidth.

One aim sought in the present invention is thus to guarantee the homogeneity of the coupling coefficient as a function of frequency, for each of the filters of a bank of filters based on guided wave resonators.

One aspect of the invention consists in utilizing the dependencies of the coupling coefficient and of the resonant frequency in relation to the propagation properties of the acoustic waves related to intrinsic elements of the structure (architecture of the electrodes, layer belonging to the technological stack used in the device, hereinafter called the differentiation layer, etc.).

Variations in propagation properties (propagation speed and/or mass) do indeed significantly affect the coupling coefficient and the resonant frequency, doing so in a more marked manner when the modification occurs in a region of the structure in which the acoustic fields are highest.

More precisely, an important aspect of the present invention consists in utilizing the dependency of the coupling coefficient with the propagation properties of one of the layers of the technological stack, hereinafter called the differentiation layer. Variations in propagation properties (propagation speed and/or mass) of this layer must significantly affect the coupling coefficient, hence the latter must be located in a region of the structure where the acoustic fields are highest.

One embodiment of the present invention provides a guided acoustic wave resonant device comprising at least two filters, each filter comprising at least two acoustic wave resonators, each filter being characterized by a useful frequency band centered on a central frequency, each resonator comprising at least one suite of inter-digitated upper electrodes exhibiting a periodic structure of period and a layer of piezoelectric material, each resonator being characterized by a coupling coefficient and a resonant frequency, characterized in that at least one of the resonators comprises a so-called differentiation layer making it possible in combination with the period of the inter-digitated electrodes to modify the coupling coefficient of the said resonator, the useful band and the central frequency being determined by the resonant frequencies and the coupling coefficients of the resonators which are adapted so as to have a determined useful bandwidth.

According to a variant of the invention, the differentiation layer of the resonator furthermore makes it possible in combination with the period of the inter-digitated electrodes to modify the resonant frequency.

Advantageously the coupling coefficient and the resonant frequency may be adjusted independently.

According to a variant of the invention, the differentiation layer of the resonator furthermore makes it possible in combination with the period of the inter-digitated electrodes to modify the resonant frequency.

According to a variant of the invention, the differentiation layers are positioned on the surface of the resonators.

According to a variant of the invention, the differentiation layers are positioned between the resonators and the substrate.

According to a variant of the invention, the resonators are produced on the surface of a common stack of layers ensuring a Bragg mirror function, the said Bragg mirror being on the surface of a substrate.

According to a variant of the invention, the differentiation layers belong to one of the constituent layers of the stack of the Bragg mirror.

According to a variant of the invention, the differentiation layers comprise porous elements making it possible to modify the acoustic characteristics thereof.

Advantageously, the acoustic characteristics may be modified notably through the density of the layers, the dimensions of their patterns, their geometries.

According to a variant of the invention, the differentiation layers comprise structures exhibiting sub-micronic patterns making it possible to modify the density thereof.

According to a variant of the invention, at least one part of the resonators comprises several differentiation layers.

According to a variant of the invention, the resonators furthermore comprise a so-called lower electrode.

According to a variant of the invention, the so-called lower electrode is a continuous electrode.

According to a variant of the invention, the lower electrode is a comb of inter-digitated electrodes.

According to a variant of the invention, the device comprises a membrane structure coupled to the resonators making it possible to create a gap capable of confining the acoustic waves in the piezoelectric material.

BRIEF DESCRIPTION OF THE DRAWINGS

The invention will be better understood and other advantages will become apparent on reading the non-limiting description which follows and by virtue of the appended figures among which:

FIGS. 1a to 1f illustrate structures of guided acoustic wave resonators produced on Bragg mirrors according to the known art;

FIGS. 2a and 2b illustrate examples of structures of Lamb wave resonators making it possible to limit energy leakages;

DETAILED DESCRIPTION

In a general manner, embodiments of the present invention can advantageously comprise a device on the surface of a substrate, a Bragg mirror produced by a stack of layers, on the surface of which is positioned the piezoelectric material in which acoustic waves of Lamb-wave type can propagate.

Upper electrodes advantageously produced in the form of inter-digitated electrode combs are positioned on the surface of the said piezoelectric material so as to allow, on the basis of an electrical excitation, the generation and propagation of acoustic waves. They comprise periodic patterns of spacings, the alteration of which makes it possible to adjust the coupling coefficient of the said resonator.

So as to benefit from an additional degree of optimization of the coupling coefficients, the present invention proposes that the design rules for the electrodes of the inter-digitated combs, and therefore the spacing of the arrays of electrodes, be associated with the introduction of a layer called the differentiation layer, in such a way that the propagation properties of the waves can be modified with greater latitude.

We shall hereinafter describe various embodiments of the invention within the framework of resonators produced on the surface of a Bragg mirror, but the invention may be applied in a more general manner to devices without a Bragg mirror, typically in membrane structures comprising air gaps making it possible to insulate the acoustic waves within the piezoelectric material.

For the sake of simplification, the remainder of the description is based on resonators forming bandpass filters.

Figure 3:
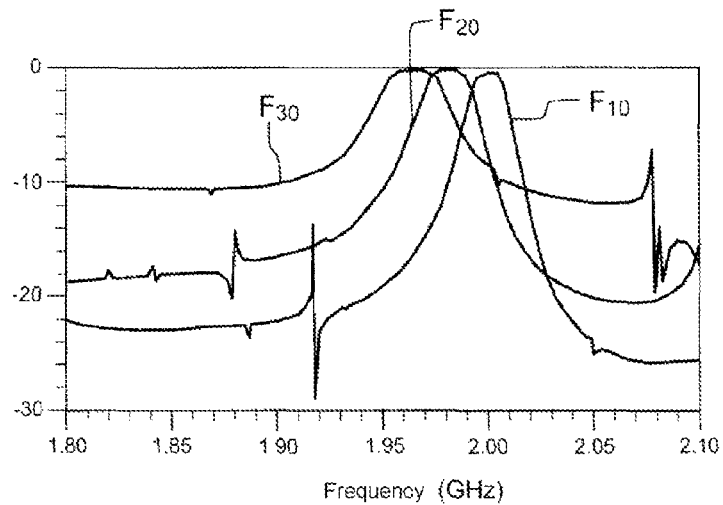
FIG. 3 illustrates the performance obtained with an exemplary bank of 3 filters comprising a guided wave resonator structure based on the stack of that described in table T1.
Figure 4:
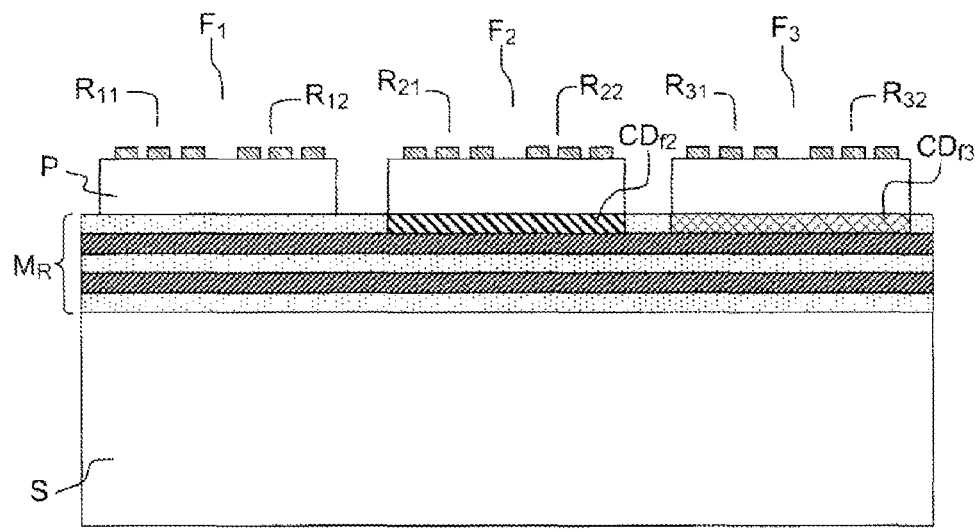
FIG. 4 illustrates a first variant of the device of the invention.

In this configuration, the device comprises, as illustrated in FIG. 4, a set of, for example, 3 filters $F_1$, $F_2$ and $F_3$.

Each filter comprises two resonators respectively $R_{11}$ and $R_{12}$, $R_{21}$ and $R_{22}$, $R_{31}$ and $R_{32}$, produced on the surface of the Bragg mirror structure and comprising inter-digitated electrode combs, respectively of electrode spacings $\Delta_{11}$, $\Delta_{12}$, $\Delta_{21}$, $\Delta_{22}$, $\Delta_{31}$, $\Delta_{32}$ (not represented).

The bandwidths $B_1$, $B_2$, $B_3$ of the filters $F_1$, $F_2$ and $F_3$ are to a first approximation of the order of $k^2$ if it is considered that within one and the same filter the resonant frequencies are close, as are the anti-resonant frequencies.

$$k^2 = \frac{f_a - f_r}{f_a}$$

According to the example illustrated in FIG. 4, the device furthermore comprises two differentiation layers $CDf_2$ and $CDf_3$ which can typically be elements situated at the level of the upper layer of the Bragg mirror.

Indeed, any modification of the thickness gives rise to a variation of the phase of the reflection coefficient of the Bragg mirror, caused by a variation of the acoustic path of the waves entering and then emerging from this mirror. This variation acts to first order on the resonant frequency, and on the boundary conditions of the waveguide (the piezoelectric layer), thereby also bringing about a variation in the piezoelectric coupling coefficient.

The variation in resonant frequency is moreover compensated by a variation in the period of the inter-digitated comb-like electrodes so that only the variation of the piezoelectric coupling coefficient remains, but there is no longer also a change of frequency.

A density variation can have similar effects: such a modification of the medium may be obtained by porosifying the material employed, for example, by varying the porosity of a layer of porous silicon as described elsewhere, or by artificially structuring according to patterns of negligible size compared with the wavelength, in such a way that the medium and its inclusions behave almost as a homogeneous material as described elsewhere.

The differentiation layer can also be a deeper layer of the Bragg mirror, but in this case, much more considerable variations of properties have to be envisaged for one and the same global effect sought on the resonator.

Alternatively, layers deposited above the guided wave resonators can be tailored in the same manner, whether or not they use a Bragg mirror. In the latter case, it is even possible to contemplate positioning this layer under the resonator.

Finally, the various approaches can be amalgamated.

In practice, by modifying the differentiation layer or layers locally at the places where the various filters of the bank are produced, it is possible to successfully provide several stacks produced on one and the same plate allowing the production of filters having equal bandwidths although they are aimed at different frequencies.

The differentiation layers are not necessarily produced using the same material, and this may make it possible to exploit selectivities of etching so as not to degrade the lower layer. In all relevant cases, these layers must modify the propagation properties of the guided waves, but without however degrading the confinement afforded by the Bragg mirror.

In accordance with one embodiment of the present invention, it is possible to modify the stack locally at the level of each filter, thereby integrating differentiation layers at the level of the Bragg mirror structure.

In the case of a stack such as that described previously in Table T1, it is possible by modifying the thickness of the upper layer of the Bragg mirror, i.e. the thickness of the $SiO_2$ layer, to influence the coupling coefficient.

Figure 5:
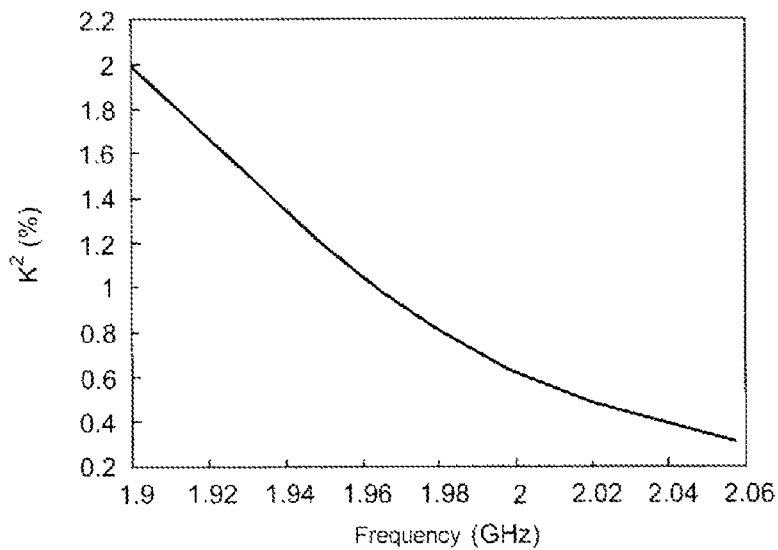
FIG. 5 illustrates the variation of the coupling coefficient as a function of frequency for the guided wave component summarized in table T1.

FIG. 5 illustrates in this respect the variation of the coupling coefficient as a function of frequency for the guided wave component summarized in Table T1.

Figure 6:
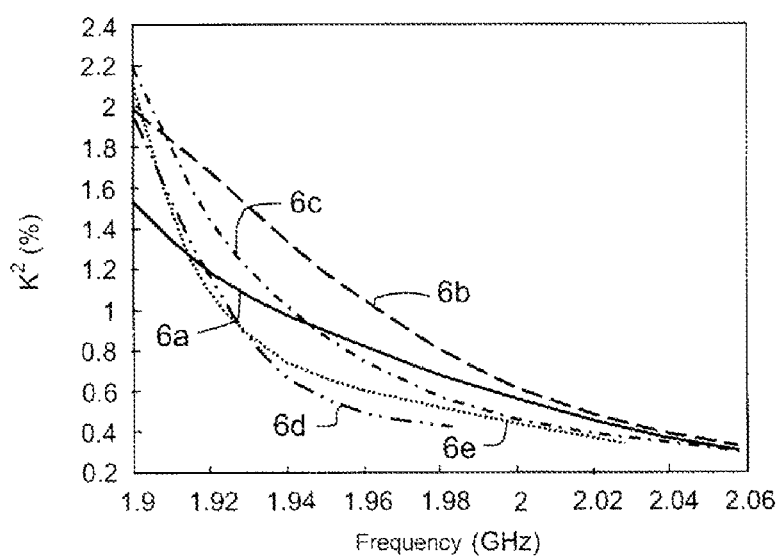
FIG. 6 illustrates the variation of the coupling coefficient as a function of frequency for several thicknesses of the upper layer of the Bragg mirror.

FIG. 6 shows the evolution of this coupling coefficient for several thicknesses of upper $SiO_2$ layer, of the Bragg mirror. It is very clearly apparent that, to be able to ensure a similar coupling coefficient for the various resonators (of the order of 0.6%), it is necessary to use a thickness of 210 nm for this layer for the filter at 2 GHz, a thickness of 310 nm for the filter at 1.98 GHz and a thickness of 510 nm for the filter at 1.96 GHz.

This is related to the fact that variations of the thickness of the upper layer of the Bragg mirror give rise to a change of the boundary conditions placed on the guiding layer, and therefore give rise to a modification of the effective piezoelectric coupling coefficient.

However, the evolution of this variation is not the same at all frequencies, as shown by the crossovers between visible curves constituting the chart of FIG. 6.

Curve 6a corresponds to a thickness of 110 nm.
Curve 6b corresponds to a thickness of 210 nm.
Curve 6c corresponds to a thickness of 310 nm.
Curve 6d corresponds to a thickness of 410 nm.
Curve 6e corresponds to a thickness of 510 nm.

By using such a chart and therefore by integrating $SiO_2$ differentiation layers of different thicknesses, it becomes possible for the widths of three filters $F_1$, $F_2$ and $F_3$, produced with the stacks described in table T1, to be made uniform (to within the $SiO_2$ layers which are differentiated).

The characteristics of an exemplary device of the invention comprising three filters comprising a Bragg mirror structure and within which the differentiation layers have been produced by modifying the thickness of the upper layer of $SiO_2$ present at the level of the Bragg mirror structure are given hereinafter:

|  | Resonator 1 | Resonator 2 |
|---|---|---|
| $SiO_2$ thickness | 210 nm | |
| Period | 10 μm | 8.5 μm |
| Fr | 1984.5 MHz | 2000 MHz |
| Fa | 1999.5 MHz | 2012.4 MHz |
| $k^2$ | 0.75% | 0.61% |

Filter $F_1$: centered on 2 GHz

|  | Resonator 1 | Resonator 2 |
|---|---|---|
| $SiO_2$ thickness | 310 nm | |
| Period | 7 μm | 6.3 μm |
| Fr | 1964.1 MHz | 1979.7 MHz |
| Fa | 1978.5 MHz | 1991.1 MHz |
| $k^2$ | 0.72% | 0.57% |

Filter $F_2$: centered on 1.98 GHz

|  | Resonator 1 | Resonator 2 |
|---|---|---|
| $SiO_2$ thickness | 510 nm | |
| Period | 4.6 μm | 4.4 μm |
| Fr | 1948.2 MHz | 1957.8 MHz |
| Fa | 1959.6 MHz | 1968.0 MHz |
| $k^2$ | 0.58% | 0.51% |

Filter $F_3$: centered on 1.96 GHz

Figure 7:
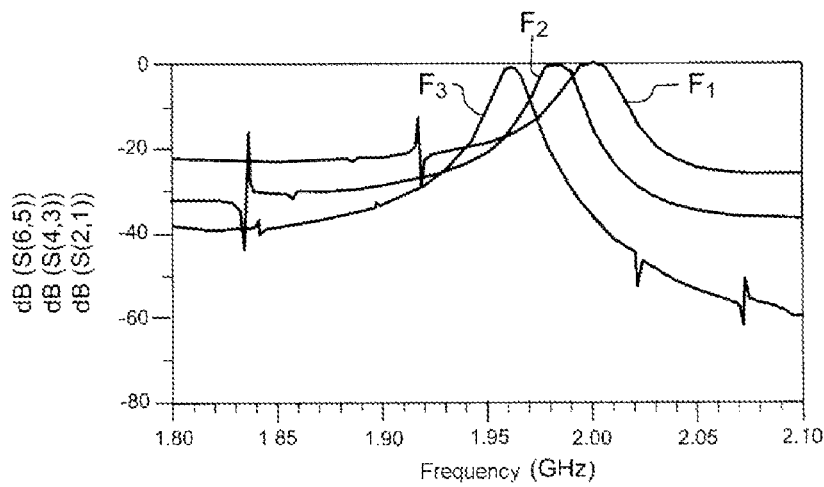
FIG. 7 illustrates the responses of filters at 1.96, 1.98 and 2.00 GHz produced with stacks exhibiting respective thicknesses of the upper layer of the Bragg mirror of 510, 310 and 210 nm in an exemplary device of the invention.

The performance of this exemplary bank of filters is illustrated in FIG. 7 which provides the responses through the curves $F_3$, $F_2$ and $F_1$ of the three filters at 1.96, 1.98 and 2.00 GHz produced with stacks exhibiting respective thicknesses of the upper layer of the Bragg mirror of 510, 310 and 210 nm.

These curves validate the fact that filters having substantially equal bandwidths can be successfully produced.

Figure 8A:
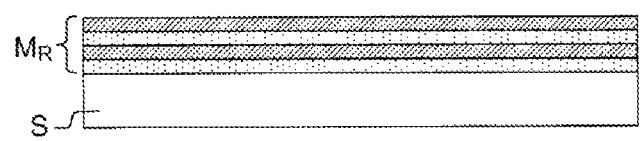
FIGS. 8a to 8d illustrate the steps for producing a first variant of a device of the invention.
Figure 8B:
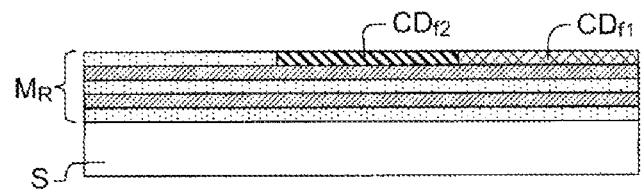
Figure 8C:
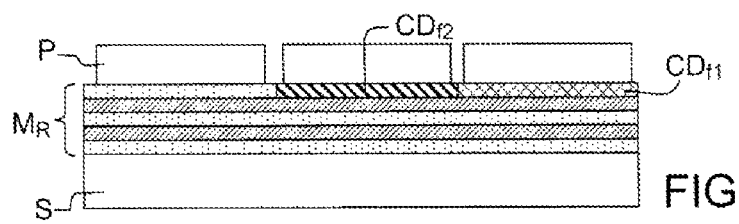

According to a first embodiment of an exemplary device of the invention, the various steps illustrated in FIGS. 8a to 8d are as follows:

Step 1 illustrated in FIG. 8a: the layers forming the Bragg mirror MR are deposited on the surface of a substrate S. If metallic layers are used, these layers must be structured so as to avoid any stray capacitive coupling between resonators;

Step 2 illustrated in FIG. 8b: differentiation layers $CDf_1$ and $CDf_2$ are produced. For this purpose, patterns which are small relative to the wavelength are etched so as to reduce the effective density of the layer and its uniformity. These patterns may be filled with another material, and then planarized, so as to provide a medium presenting a compromise between the material forming the matrix and the material forming the inclusions. The volume ratio of the inclusions to the matrix is then varied so as to provide a different effective medium for each resonator. This variation of properties is defined by the photolithography patterns. It is therefore possible to envisage a large number of variations without adding a further technological step. An alternative may be to porosify the layer, by varying the porosity from place to place so as to arrive at the same effect. Nonetheless this requires a masking which is specific to each component produced, and this may turn out to be expensive;

Step 3 illustrated in FIG. 8c: a piezoelectric material layer P is deposited and is structured so as to delimit the three filters $F_1$, $F_2$ and $F_3$.

Figure 8D:
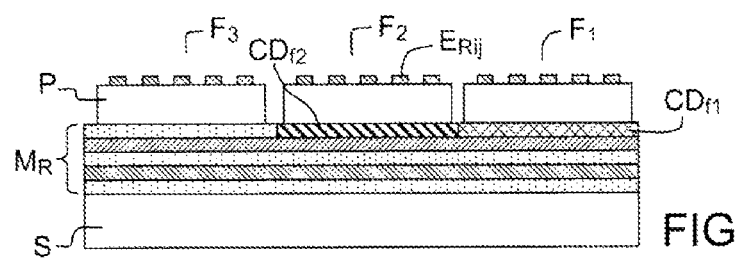

Step 4 illustrated in FIG. 8d: a metallic layer is deposited on the various structured elements of piezoelectric material and is structured so as to produce the constituent inter-digitated electrode combs $E_{Rij}$ forming the upper electrodes.

Figure 9A:
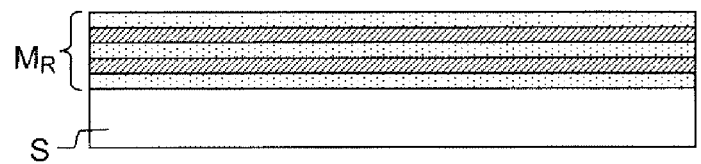
FIGS. 9a to 9d illustrate the steps for producing a second variant of the invention.
Figure 9B:
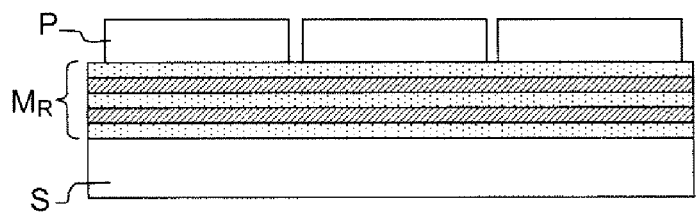
Figure 9C:
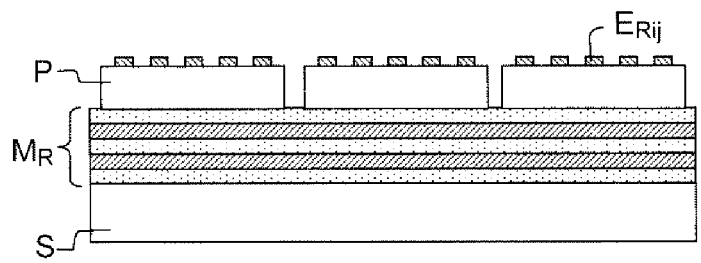
Figure 9D:
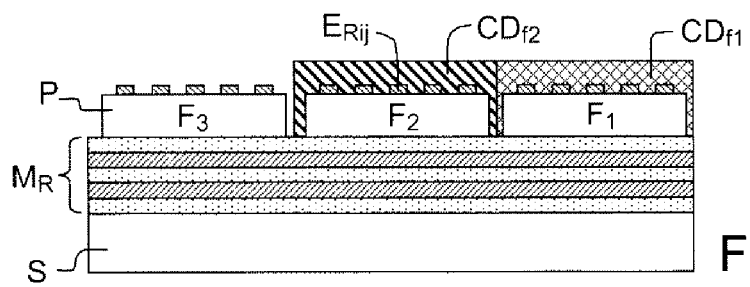

According to a second embodiment the various steps illustrated in FIGS. 9a to 9d are as follows:

Step 1 illustrated in FIG. 9a: the layers forming the Bragg mirror MR are deposited. If metallic layers are used, these layers must be structured so as to avoid any stray capacitive coupling between resonators;

Step 2 illustrated in FIG. 9b: a piezoelectric material layer is deposited and structured so as to delimit the three filters $F_1$, $F_2$ and $F_3$;

Step 3 illustrated in FIG. 9c: a metallic layer is deposited on the various structured elements of piezoelectric material and is structured so as to produce the constituent inter-digitated electrode combs forming the upper electrodes $E_{Rij}$;

Step 4 illustrated in FIG. 9d: an upper layer is deposited and structured. This layer is thereafter etched with sub-wavelength patterns, optionally filled with a filling material, but this is not necessary, so as to provide a metamaterial exhibiting effective properties lying between those of the inclusion and of the matrix, modulated by the volume ratio of inclusions to matrix. These volume ratios are varied from resonator to resonator to arrive at the desired effect and they make it possible to define the two layers $CDf_1$ and $CDf_2$. The benefit of this solution is that the differentiation is entirely controlled by the photolithography patterns used, therefore by the designer. An alternative may be to porosify the material, by varying the porosity locally. However, relative to structuring, this solution requires a series of maskings making it possible to insulate each resonator or filter.

Figure 10A:
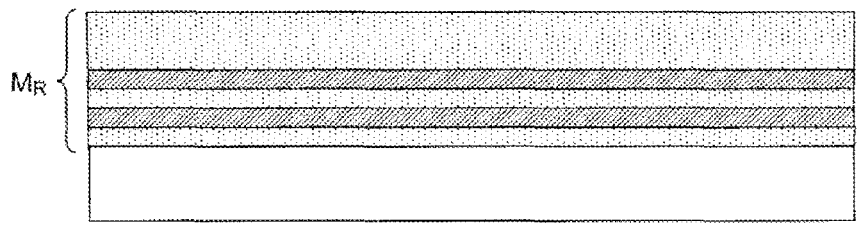
FIGS. 10a to 10d illustrate the steps for producing a third variant of the invention.
Figure 10B:
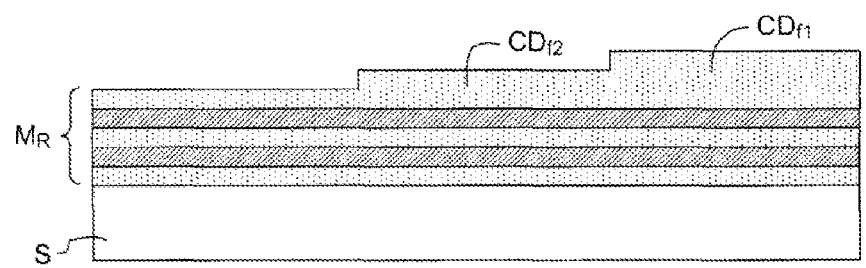
Figure 10C:
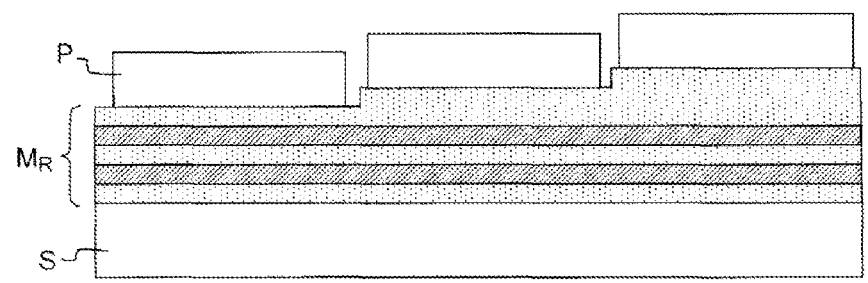
Figure 10D:
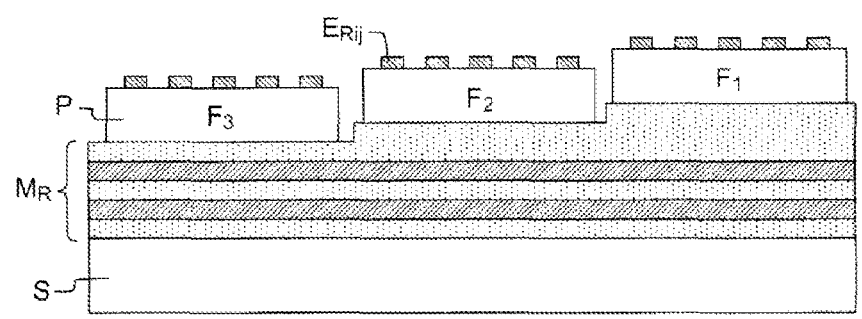

According to a third embodiment the various steps illustrated in FIGS. 10a to 10d are as follows:

Step 1 illustrated in FIG. 10a: the layers making up the Bragg mirror are deposited. In the most general case, simple depositions suffice. If electrically conducting materials are ever used, it may be useful to structure the metallic layers to avoid any capacitive coupling between resonators;

Step 2 illustrated in FIG. 10b: a succession of partial etchings is undertaken, intended to provide several thicknesses for the upper layer of the Bragg mirror making it possible to define differentiation layers $CDf_1$ and $CDf_2$ of different thicknesses;

Step 3 illustrated in FIG. 10c: the depositions of a piezoelectric layer P are undertaken. This optionally follows the deposition and the structuring of a first metallic layer;

Step 4 illustrated in FIG. 10d: the deposition of a metallic layer and the structuring of the electrodes $E_{Rij}$ situated above the piezoelectric layer are undertaken. In order to passivate the component, or to comply with other specifications, further depositions may be carried out.

Figure 11A:
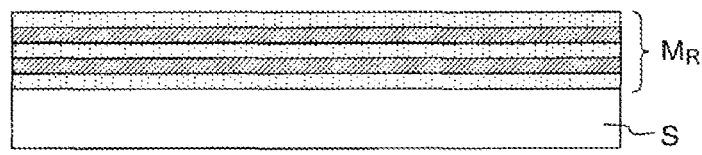
FIGS. 11a to 11f illustrate the steps for producing a fourth variant of the invention.
Figure 11B:
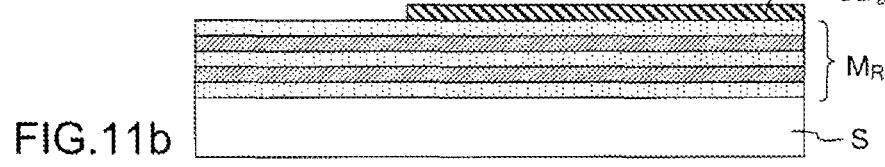
Figure 11C:
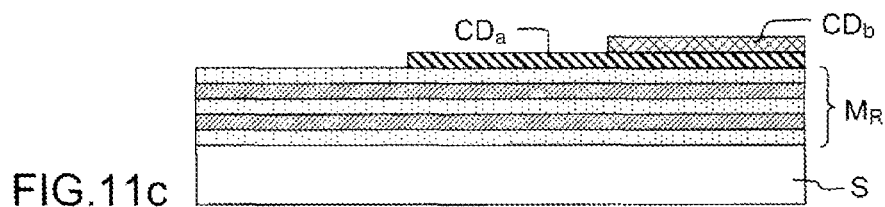
Figure 11D:
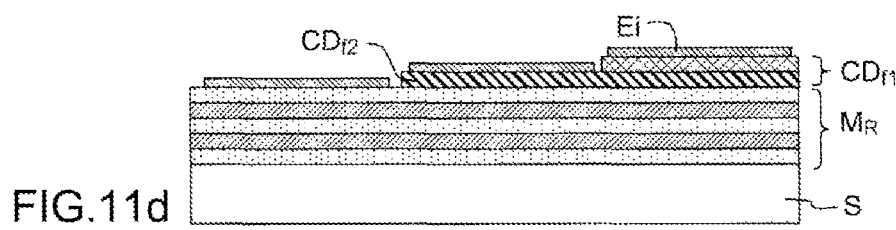
Figure 11E:
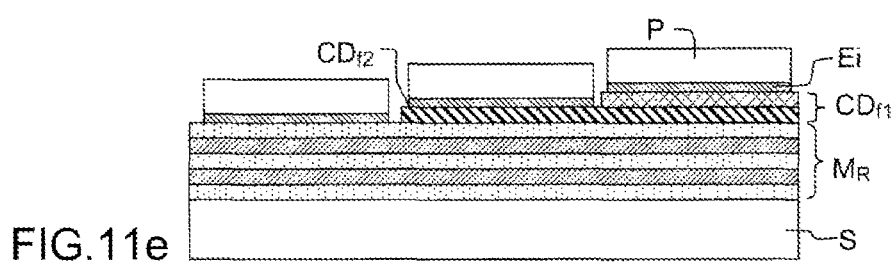
Figure 11F:
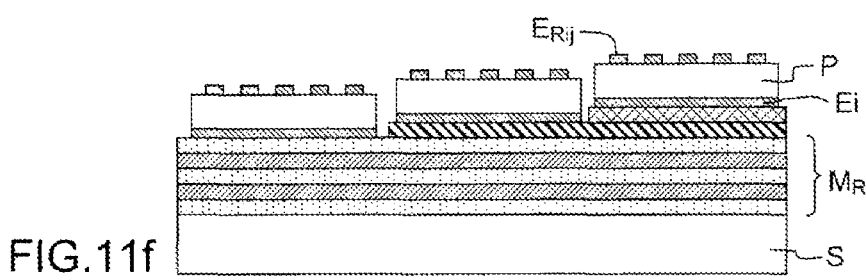

According to a fourth embodiment the various steps illustrated in FIGS. 11a to 11f are as follows:

Step 1 illustrated in FIG. 11a: the layers forming the Bragg mirror MR are deposited. Just as for the previous cases, if metallic layers are used, these layers must be structured so as to avoid any stray capacitive coupling between resonators;

Step 2 illustrated in FIG. 11b: the deposition and the structuring of a first layer $CD_a$ are undertaken;

Step 3 illustrated in FIG. 11c: the deposition and structuring of a second layer $CD_b$ are undertaken; the stack of layers $CD_a$ and $CD_b$ constitutes the equivalent of a differentiation layer $CDf_1$ and the layer $CD_b$ alone constitutes the equivalent of the differentiation layer $CDf_2$;

Step 4 illustrated in FIG. 11d: the deposition of a metallic layer and the structuring of the lower electrodes Ei are undertaken;

Step 5 illustrated in FIG. 11e: the deposition and the structuring (if required) of the piezoelectric layer are undertaken;

Step 6 illustrated in FIG. 11f: the deposition and the structuring of the upper electrodes are undertaken. Other depositions can follow, with a view to passivating, for example, the components.

Figure 12A:
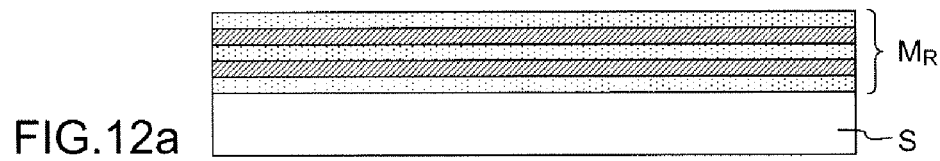
FIGS. 12a to 12f illustrate the steps for producing a fifth variant of the invention.
Figure 12B:
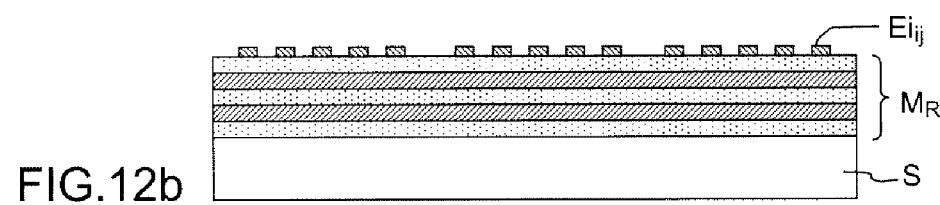
Figure 12C:
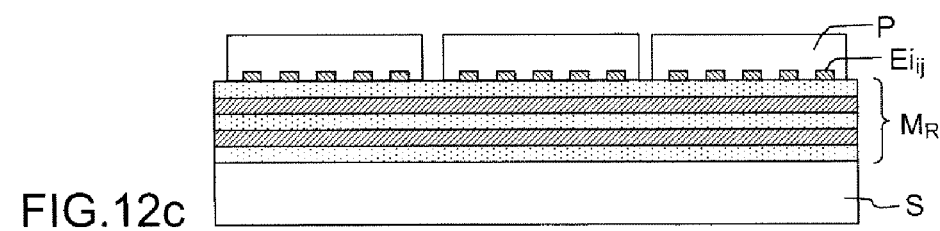
Figure 12D:
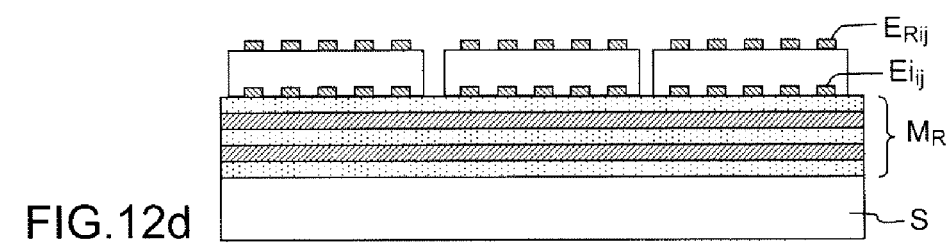
Figure 12E:
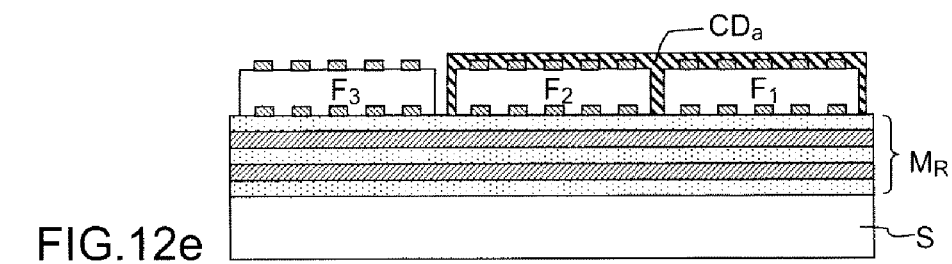
Figure 12F:
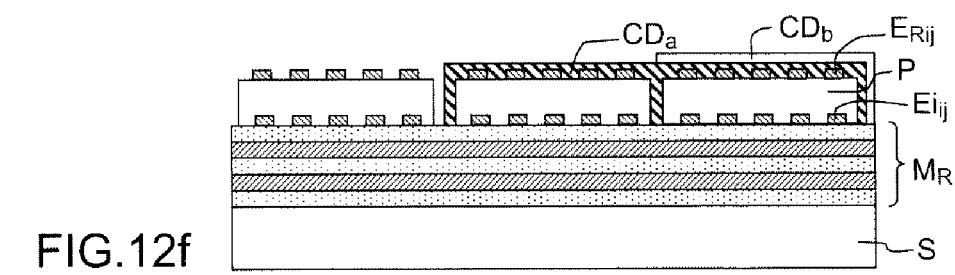

According to a fifth embodiment the various steps illustrated in FIGS. 12a to 12f are as follows:

Step 1 illustrated in FIG. 12a: the layers forming the Bragg mirror MR are deposited on the surface of a substrate S. Just as for the previous cases, if metallic layers are used, these layers must be structured so as to avoid any stray capacitive coupling between resonators;

Step 2 illustrated in FIG. 12b: the deposition and structuring (if required) of lower electrodes $Ei_{ij}$ are undertaken;

Step 3 illustrated in FIG. 12c: the deposition and the structuring (if required) of the piezoelectric layer P are undertaken;

Step 4 illustrated in FIG. 12d: the deposition and the structuring of the upper electrodes $E_{Rij}$ are undertaken;

Step 5 illustrated in FIG. 12e: the deposition and the structuring of a first layer CDa are undertaken;

Step 6 illustrated in FIG. 12f: the deposition of a second layer $CD_b$ is undertaken. The differentiation layers between filters $F_1$, $F_2$ and $F_3$ consist respectively of a stack of layers $CD_a$ and $CD_b$ and of the layer $CD_a$. The latter deposition can thereafter be followed by further depositions, for purposes other than the subject covered by this invention (passivation, for example, etc.). Alternatively, the differentiation between filters and/or resonators can be done by partial etching of this layer.

Figure 13A:
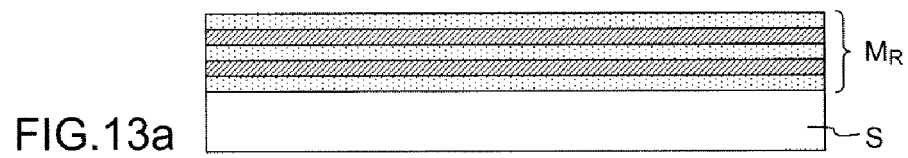
FIGS. 13a to 13f illustrate the steps for producing a sixth variant of the invention.
Figure 13B:
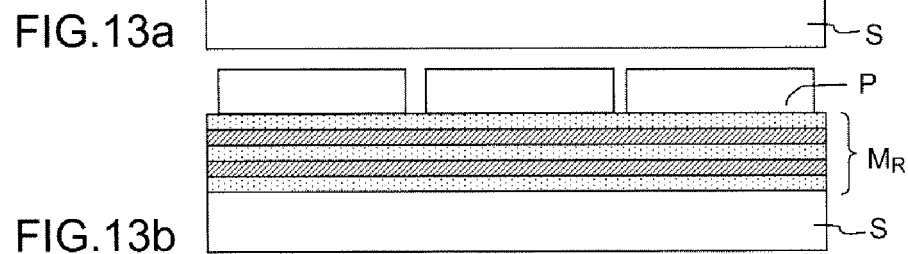
Figure 13C:
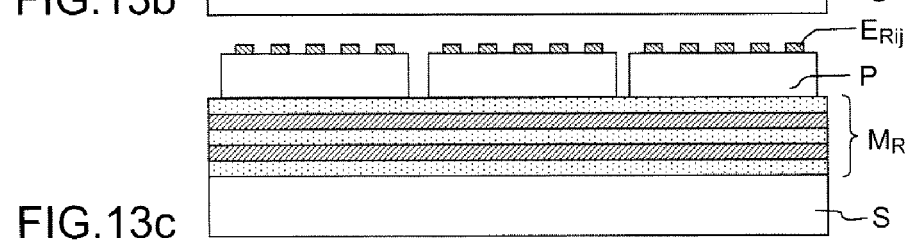
Figure 13D:
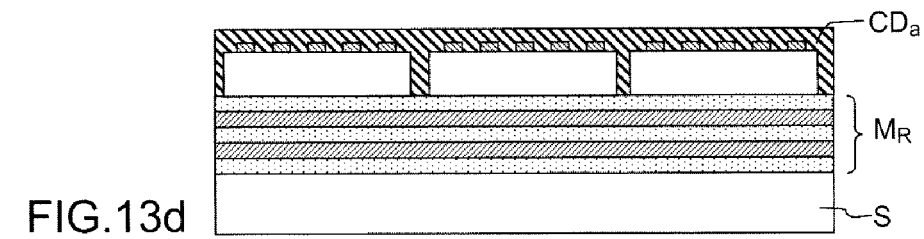
Figure 13E:
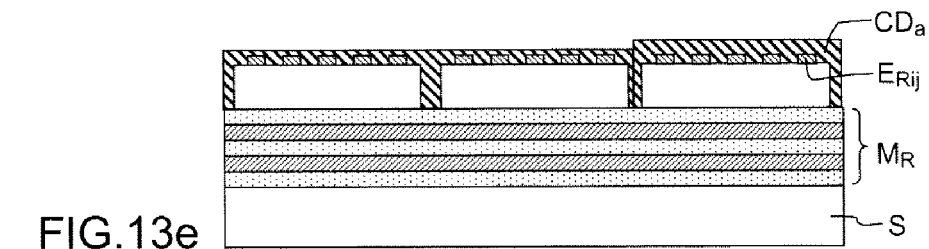
Figure 13F:
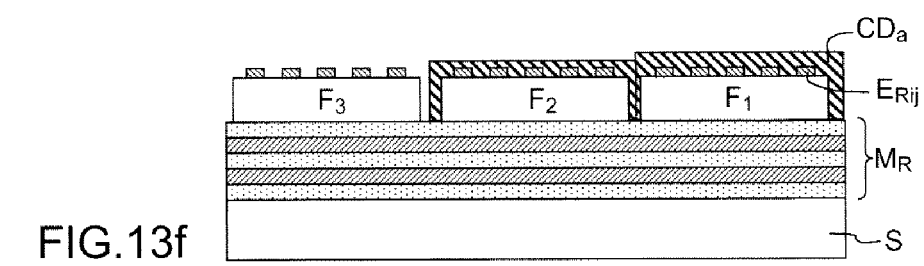

According to a sixth embodiment the various steps illustrated in FIGS. 13a to 13f are as follows:

Step 1 illustrated in FIG. 13a: the deposition of the layers forming the Bragg mirror is undertaken. Just as for the previous cases, if metallic layers are used, these layers must be structured so as to avoid any stray capacitive coupling between resonators;

Step 2 illustrated in FIG. 13b: the deposition and structuring (if required) of the piezoelectric layer P are undertaken;

Step 3 illustrated in FIG. 13c: the deposition and structuring of the upper electrodes $E_{Rij}$ are undertaken:

Step 4 illustrated in FIG. 13d: the deposition of the layer $CD_a$ which will serve to form the differentiation layers is undertaken;

Step 5 illustrated in FIG. 13e: the partial etching(s) of the layer $CD_a$ is (are) carried out;

Step 6 illustrated in FIG. 13f: the total etching of the differentiation layer is carried out just where the latter is not necessary. A differentiation layer $CDf_1$, a differentiation layer $CDf_2$ and differentiation layer spacing have thus been defined at the level of the 3 filters $F_1$, $F_2$ and $F_3$ on the basis of a single layer and by different etching operations.

For each of these embodiments described above, a type of resonators and of filters which differ has been considered, but this was merely illustrative. The types of resonators can be freely swapped. Likewise, for one and the same embodiment described, guided wave resonator structures other than those described may be employed.

Likewise, only the production of resonators using Bragg mirrors has been described, but the same approaches may be used on structures of resonators on membranes. Typically in the case of three filters, three membranes are produced, it being possible for the differentiation layers to be produced either above the upper electrodes or at the level of the air gaps of the membranes.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A guided acoustic wave resonant device, comprising:
   at least two filters, each filter comprising at least two acoustic wave resonators, each filter having a useful frequency band centered on a central frequency, the at least two central frequencies being different, each resonator comprising at least one suite of inter-digitated upper electrodes exhibiting a periodic structure having a period and a thin layer of piezoelectric material, each resonator having a coupling coefficient and a resonant frequency; and
   at least one differentiation layer associated with at least one of the resonators of at least one of the at least two filters;
   wherein the at least one differentiation layer includes differentiation layer associated with at least one of the resonators of one filter, such that the at least two acoustic wave resonators of said filter are positioned at the differentiation layer;
   wherein the at least one differentiation layer makes it possible in combination with the period of the inter-digitated electrodes to modify the coupling coefficient of the associated resonator, the useful frequency band and the central frequency being determined by the resonant frequencies and the coupling coefficients of the resonators; and
   wherein the coupling coefficients of the resonators are adapted so as to provide a determined useful bandwidth, and to make uniform the bandwidths of the useful frequency bands.

2. The device according to claim 1, wherein the at least one differentiation layer of the associated resonator is used in combination with the period of the inter-digitated electrodes to modify the resonant frequency.

3. The device according to claim 1, wherein the at least one differentiation layer is positioned on a surface of the associated resonator.

4. The device according to claim 1, wherein the at least one differentiation layer is positioned between the associated resonator and a substrate.

5. The device according to claim 4, wherein the resonators are produced on a surface of a common stack of layers ensuring a Bragg mirror function, wherein a Bragg mirror is defined on a surface of the substrate.

6. The device according to claim 5, wherein the at least one differentiation layer belongs to one of the constituent layers of the stack of the Bragg mirror.

7. The device according to claim 1, wherein the at least one differentiation layer comprises porous elements to modify the acoustic characteristics thereof.

8. The device according to claim 1, wherein the at least one differentiation layer comprises structures exhibiting sub-micronic patterns to modify the acoustic characteristics thereof.

9. The device according to claim 1, wherein at least one part of the resonators comprises several differentiation layers.

10. The device according to claim 1, wherein the resonators further comprise a lower electrode.

11. The device according to claim 10, wherein the lower electrode is a continuous electrode.

12. The device according to claim 10, wherein the lower electrode is a comb of inter-digitated electrodes.

13. The device according to claim 1, wherein the device comprises a membrane structure coupled to the resonators making it possible to create a gap capable of confining the acoustic waves in the piezoelectric material.

* * * * *